United States Patent [19]
Redel

[11] 4,024,376

[45] May 17, 1977

[54] DEVICE FOR MEASURING THE EVAPORATION RATE IN VACUUM EVAPORATION PROCESSES

[75] Inventor: Karl-Georg Redel, Rodenbach, Germany

[73] Assignee: Leybold-Heraeus GmbH & Co. KG, Cologne, Germany

[22] Filed: June 13, 1975

[21] Appl. No.: 586,657

[52] U.S. Cl. .............................. 219/272; 118/5; 118/7; 118/49.1; 219/271
[51] Int. Cl.² .......................................... C23C 13/08
[58] Field of Search ............ 219/271, 272; 118/48, 118/49, 49.1, 49.5, 5, 7

[56] References Cited
UNITED STATES PATENTS

| | | | |
|---|---|---|---|
| 3,235,480 | 2/1966 | Swartz et al. | 118/5 UX |
| 3,313,914 | 4/1967 | Roberts, Jr. et al. | 219/272 |
| 3,316,386 | 4/1967 | Yaffe et al. | 118/49 X |
| 3,654,109 | 4/1972 | Hohl et al. | 118/49.5 X |

FOREIGN PATENTS OR APPLICATIONS 1,010,456  11/1965  United Kingdom .............. 118/49.5

*Primary Examiner*—C. L. Albritton
*Attorney, Agent, or Firm*—Joseph F. Padlon

[57] ABSTRACT

A measuring device for determining the rate of evaporation of materials in vacuum systems, particularly for producing thin layers of precise thickness on substrates. An electrically conducting housing has an opening which can be aligned with the material to be evaporated. An electrode located within the housing and insulated therefrom, is connected to an evaluation device for the evaporation rate. The electrode is located outside the line of sight through the opening of the housing, and the electrode has a positive potential with respect to the housing. The current flowing between the housing and the electrode is applied to the evaluation device.

7 Claims, 6 Drawing Figures

DEVICE FOR MEASURING THE EVAPORATION RATE IN VACUUM EVAPORATION PROCESSES

BACKGROUND OF THE INVENTION

The present invention relates to a measuring device for determining the evaporation rate of evaporation materials in vacuum systems, in particular for producing thin layers of exact thickness on substrates. The device has an electrically conducting housing with an opening which can be aligned with the evaporation material, and an electrode located inside the housing and insulated from the housing. This electrode is connected to an evaluation device for the evaporation rate.

A measuring device of the type described above is already known in the art, for example from the paper "An evaporation Rate Control System Employing a Heated Electrode Sensing Gauge" by M. H. Perkins, published in Trans. of the 8th Vacuum Sym. and 2nd Intern. Congress, 1961, pp. 1025 through 1030. The measuring device described there has the shape of a probe in the manner of an ionization manometer and is located directly in the main vapor stream. Aside from the fact that part of the vapor stream is shielded thereby, with a cold probe, vapors may condense on parts of the probe and in the course of time may make the probe useless. In order to eliminate influence on the measured result, anode and collector, during probe operation, are heated to a temperature of approximately 1000° C. This requires not only a regulating system for the heater currents, but also suitable connecting cables which must withstand the high operation temperatures. The already known measuring probe requires eight separate connections requiring a correspondingly complicated design. Furthermore, there always is the danger that the heating conductor burns out so that a spare heating element is provided. Hence the already known device poses considerable requirements on the qualifications of the operating personnel during operation and regular monitoring of the known measuring probe.

From U.S. Pat. No. 3,168,418 there is already known a measuring device for the evaporation rate in vacuum evaporation systems which are preheated by vapor stream. The intensity of the vapor stream or the evaporation rate is measured by means of an additional electron beam gun by means of which the vapor is ionized in the measuring device. The resulting ion current is a measure of the evaporation rate and is used for controlling the heater power of the evaporator. The known arrangement is very complex in design and, because of the high-voltage supply to the electron beam gun and the requirement of special accelerating electrodes, requires a whole series of design measures which have a deleterious effect on the manufacturing and maintenance costs. However, a particular disadvantage is the fact that major parts of the measuring device are exposed to the main vapor stream which otherwise is narrowly limited by the measuring device. A comparable device with the inherent expenditure disclosed in U.S. Pat. No. 3,586,854, in which an electron beam oscillates in the vapor stream with a suitable catcher, is used for determining the evaporation rate.

It is, therefore, an object of the present invention to provide a measuring device of the initially described type which csn be located outside the vapor stream required for the evaporation, but which is free from wear and maintenance cost and does not require the heating of individual sections nor a high-voltage supply.

Another object of the present invention is to provide a measuring device of the foregoing character which is simple in design and construction, and may be fabricated economically.

A further object of the present invention is to provide a measuring device, as described, which has a long operating life.

SUMMARY OF THE INVENTION

The objects of the present invention are achieved by providing that an electrode is located outside the line of sight passing through the opening in the housing, and has a potential which is positive with respect to the housing. The current flowing between housing and electrode is applied to the evaluating device.

The measuring device, in accordance with the present invention, in principle, comprises only an electrically conducting housing and an electrode inside the housing. This electrode has a higher potential than the housing. The electrode may be without any heating. It expediently consists of a massive ring located inside the housing coaxially with its opening. Neither the electrode nor the entire measuring device are subject to wear, since, in the absence of a line of sight path with the evaporation material, the electrode cannot be impacted by the vapor stream. The measuring device is rugged and simple and, without additional preventive measures, can take heavy shocks and quick flooding of the vacuum chamber in which it is located. To generate the positive potential, only a voltage difference of several hundred volts, for example 500 volts, is required. As a result, no special requirements have to be made on the construction of the measuring device with respect to sufficient insulation and maintenance of the insulation values. The lead-through bushings through the vacuum chamber necessary for applying the values to be measured to an evaluation device, do not constitute a problem.

The measuring device in accordance with the present invention is intended for evaporation systems of all types, regardless of whether they are thermic evaporators with resistance heating, or electron beam evaporators with direct bombardment of the evaporation material by electron beams. The device of the present invention can also measure the evaporation rate of metal vapor which is not ionized. For example, it can measure and regulate the evaporation rate of aluminum which is located in an evaporator vessel that is directly surrounded by heater current.

A particularly simple construction where direct line of sight connection between the electrode and the evaporation material is prevented, has the feature that the opening of the housing is surrounded by a tube of such a length and the electrode is located in relation to the opening in such a way, that a direct line of sight path from outside the housing to the electrode is prevented. The required geometry for such a construction can be easily found by simple design considerations. Thus, it is, for example, evident from FIG. 1.

All parts may be of rotation symmetrical shape, with the electrode being a ring electrode and being located coaxially with the opening. However, it is expedient to locate opposite to the opening which can be aligned with the evaporation material, another opening, with the cross-sections of the openings being approximately the same. In this manner care is taken that vapor which has strayed into the inside of the measuring device can also exit.

However, it is not necessary that the electrode be rotation symmetrical, i.e., a ring electrode. It is possible to make the electrode with positive potential plate-shaped, i.e., plane, or in the shape of a ring segment, and to locate facing it, in a symmetrical arrangement in relation to the center axis, a counter electrode of similar shape with the potential of the housing. It is only necessary that each part of the electrode and the electrode of opposite potential to satisfy the requirement that a line of sight path from outside the housing to the electrode is prevented.

The novel features which are considered as characteristic for the invention are set forth in particular in the appended claims. The inventions itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
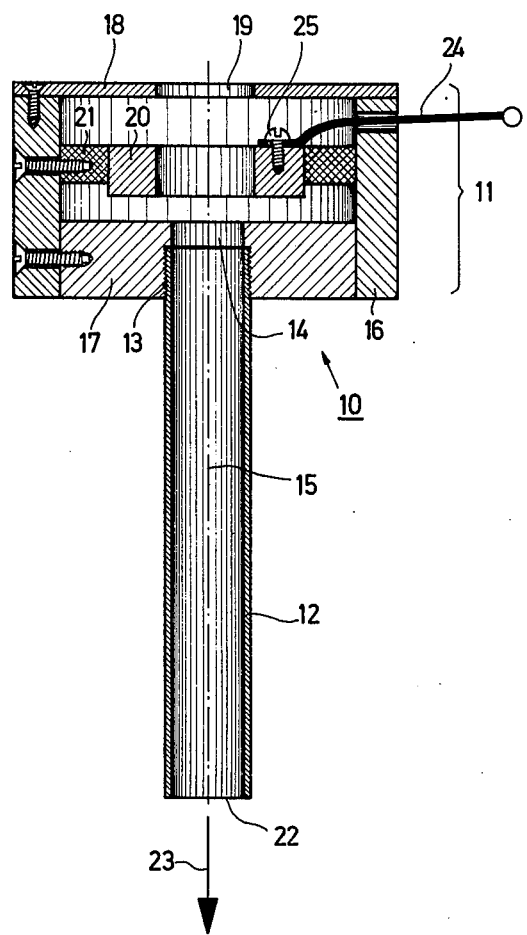
FIG. 1 is an axial sectional view through the measuring device with annular electrode, in accordance with the present invention.

In FIG. 1, reference numeral 10 denotes a measuring device comprising a cylindrical housing 11 with a coaxially attached tube 12. The tube 12 is made of aluminum and is inserted by means of thread 13 into an opening 14 which is also coaxial with the center axis 15 of the measuring device. Housing 11 comprises a hollow cylindrical jacket 16 and a closing section 17 in the form of a circular disk. This closing section is inserted into the front side of jacket 16. On the side of the housing facing the closing section 17, there is located a perforated plate 18 which has an opening 19 concentric with center axis 15. Opening 19 has the same diameter as tube 12. Jacket 16, closing section 17, and perforated plate 18, like tube 12, are made of aluminum.

Inside housing 11 and concentric with its center axis 15, there is an electrode of chrome-nickel steel which is attached by means of an insulating material ring 21, to the jacket 16 of housing 11, while maintaining uniform distance. Electrode 20 is in the shape of an annular ring whose inside diameter is slightly larger than the inside diameter of tube 12. The length of tube 12 and its inside diameter and the inside diameter of the electrode 20 are located in such a way that a direct line of sight path between electrode 20 and the environs of the measuring device through the opening 22 of the tube 12 is impossible. Suitable construction is easily obtained by applying a straight-edge.

Figure 2:
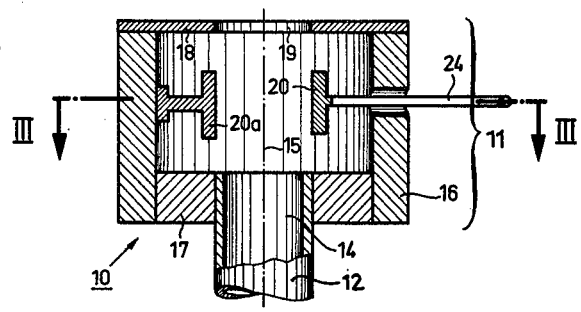
FIG. 2 shows another embodiment of FIG. 1, with a plate-shaped electrode.
Figure 3:
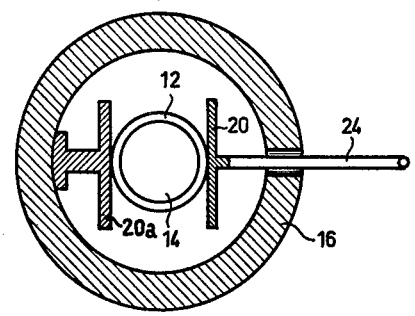
FIG. 3 shows a section taken along line III—III of FIG. 2.

In the operating position, the measuring device 10 is aligned in such a way that the opening 22 is in the direction of arrow 23 or, of the center axis 15 towards the material to be evaporated or its surface as shown in FIG. 2. A connecting line 24 is connected by means of a contact screw 25 to electrode 20. Connecting line 24 leads to an evaluation device or control arrangement shown in FIG. 6. Housing 11 is connected to the frame.

In FIGS. 2 through 5, identical parts are denoted by the same reference numeral. FIG. 2 shows a measuring device 10 whose housing 11 with tube 12 are identical with the embodiment shown in FIG. 1. However, the electrode 20 is different and is in the shape of a rectangular plate whose large surface faces the center axis 15. Again, the electrode is connected to a connection line 24 which is insulated and passed through jacket 16. It has positive potential of several hundred volts. Facing it and symmetrical with respect to the center axis 15, there is a similar plate-shaped electrode 20a which is connected electrically to jacket 16 and therefore has the same potential as housing 11. The symmetry of the arrangement is also evident from FIG. 3, which also indicates that a direct line of sight path between electrodes 20 or 20a and the environs of measuring device 10 is impossible.

Figure 4:
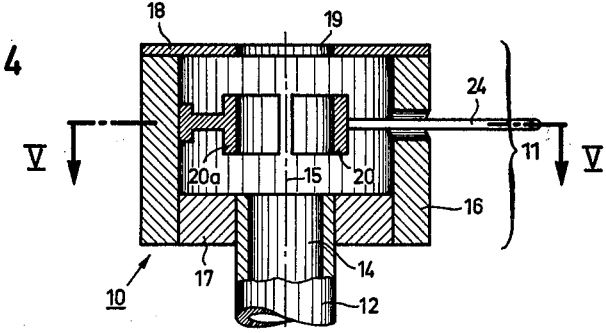
FIG. 4 is another embodiment of FIG. 1, with one electrode in the form of a ring segment or semicircle.
Figure 5:
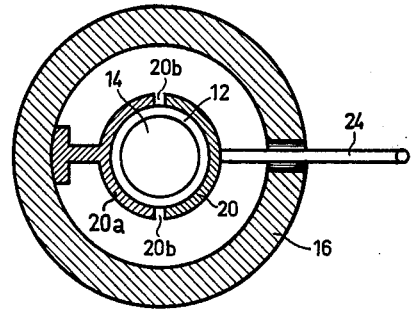
FIG. 5 shows a section taken along line V—V of FIG. 4.

In the case of the measuring device of FIG. 4, electrode 20 is made up of a ring segment which is slightly smaller than a semicircle. The axis of the ring segment is identical with center axis 15. Facing the electrode 20 and mirror symmetrical with respect to center axis 15, there is an electrode 20a which is also electrically connected to jacket 16 and therefore has the same potential. FIG. 4 in conjunction with FIG. 5 indicate that electrode 20 is separated from electrode 20a by two narrow slots 20b. In principle, the slot width depends only on the amount of potential difference. Therefore electrodes 20 and 20a nearly form an annular ring. Again it is evident that any direct line of sight path between the electrodes and the environs of the measuring device through the opening in tube 12, is impossible.

Figure 6:
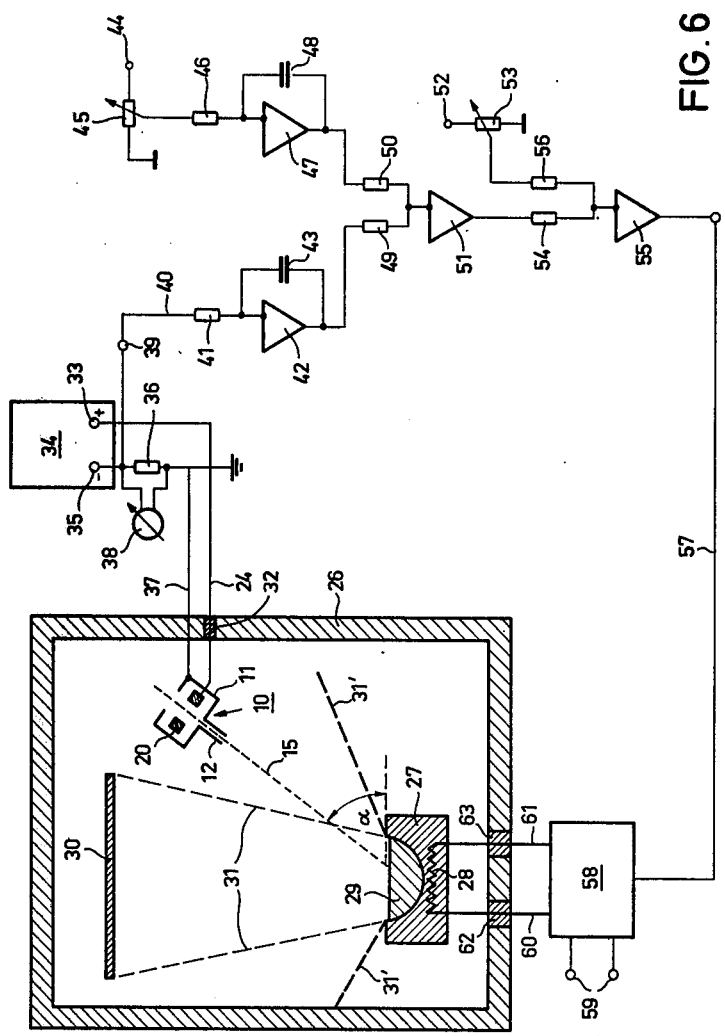
FIG. 6 is a schematic diagram of the measuring device of FIG. 1 in conjunction with a vacuum vapor deposition device connected in series with a control circuit for regulating the evaportor performance.

In FIG. 6, 26 denotes a vacuum chamber in which a resistance-heated evaporator 27 is located. The heating is accomplished by direct current passage which is symbolically indicated by resistance 28. Alternatively, the heating can be accomplished by electron bombardment. However, devices for this purpose are already known in the art and will not be described in detail here. The evaporator contains the material 29 to be evaporated, which, in order to produce a thin coating, is to be condensed on a substrate 30 located above the opening of evaporator 27. From the evaporator 27 there emanates a vapor stream whose share impacting on the substrate is limited. This is approximately indicated by the dashed line 31. Evidently, the measuring device 10 is located outside this part of the vapor stream which can also be designated as main vapor stream. The aperture angle of the total vapor stream is indicated by lines31'. It is evident that the measuring device 10 is still inside the boundary region of the vapor stream.

To the side, above evaporator 27, the measuring device 10, in accordance with the present invention, is located in such a way that the tube 12 or its center axis 15 is aligned with the center of the surface of the evaporation material 29. The center axis 15 makes and angle $\alpha$ which is approximately between 40° and 60°. This value, however, is not critical. At any rate, it is evident that the measuring device 10 is essentially outside the vapor stream between evaportor 27 and substrate 30. Connecting line 24 leading to the electrode 20 passes through an insulator bushing 32 from the vacuum chamber 26 and is connected to the positive terminal 33 of a direct-voltage source 34 which generates an output voltage of several hundred volts. The negative output terminal 35 is also connected to the frame via a resistance 36, as is the housing 11 of the measuring device 10 via line 37. As a result of this circuit arrangement, there develops at resistance 36, a voltage drop which is proportional to the current flowing in measuring device 10. The amount of voltage drop can be directly read on an evaluation device 38 connected in parallel with resistance 36. It is possible to calibrate evaluating device 38 in such a way that the evaporation rate can be read directly. Multiplying by the evaporation time, one obtains the thickness of the coating deposited on substrate 30.

However, the evaluation device described so far by means of FIG. 6 for measuring the evaporation rate of a magnitude proportional to it, can easily be turned into a closed control circuit. To this end, the voltage applied to output terminal 35 is delivered to a terminal 39. Terminal 39 is connected via line 40 to input resistance 41 of an integrating unit 42 and a condenser 43. The time constant of the integrating unit 42 is such that the full charging time of condenser 43 slightly exceeds the time interval intended for the coating of substrate 30. Hence, the output voltage of the integrating unit 42 increases with progressing evaporation and is a measure of the layer thickness.

Up to now, it was the custom to compare the measured evaporation rate directly with a given nominal value, and, depending on the amount of deviation, to influence the evaporation speed accordingly. The disadvantage of this measure is that in practical application one succeeds only rarely in obtaining a sufficiently constant evaporation rate and hence a sufficienlty constant signal. Experience has shown that the evaporation rate can deviate by more than 30 percent and in extreme cases by more than 50 percent from the mean value of the evaporation rate. Such a signal is very difficult to process in control engineering, since instabilities may easily occur. This disadvantage is avoided by the integrating unit described above.

A nominal value is fed in via an input terminal 44, and is variable by means of a nominal-value potentiometer 45. Via an input resistance 46, the nominal value is applied to another integrating unit 47 with a condenser 48. At the output of integrating unit 47, analogous to the output of integrating unit 42, there is formed a nominal value corresponding to the layer thickness.

Actual and nominal value are applied via input resistances 49 and 50, by difference formation, to an amplifier 51 which generates an output signal which is proportional to the deviation of the layer thickness. Via an input terminal 52, a nominal value is fed in which corresponds to the magnitude "evaporator power". This value can be varied via a nominal value potentiometer 53. The output of amplifier 51 is delivered via an input resistance 54 to a servo amplifier 55. The output of resistance 54 is connected to the output of resistance 56 for the purpose of a difference formation which corresponds to the nominal value picked off from the nominal value potentiometer 53. This nominal value approximately corresponds to the average power required for evaporation. From the servo amplifier 55, a line 57 leads to a final control element 58 for changing the power of the evaporator 27. The final control element is connected via terminals 59 to a current source. The regulated power is delivered to the heater resistance 28 via lines 60 and 61 which pass through insulator bushings through the wall of vacuum chamber 26.

The regulation of the evaporation process proceeds in the following manner: At the start of the evaporation process, the integrating units 42 and 47, which have before been discharged to 0, are turned on. In case of deviations from the given evaporation rate, there appears at the output of amplifier 51 a signal which corrects the power nominal value provided by the nominal-value potentiometer 53. The accuracy of the regulating process is assisted by the fact that the measuring device, in accordance with the present invention, has an absolutely constant 0 value. From the drawings in FIGS. 1 and 6 it is evident that the electrostatic field between 20 and housing 11 cannot penetrate outside the housing and influence the evaporation process.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention, and therefore, such adaptations should and are intended to be comprehended within the meaning and range of equivalence of the following claims.

I claim:

1. A measuring device for determining the evaporation rate of evaporation material in vacuum systems comprising, in combination, a source of material to be evaporated; a substrate spaced from said source of material and impacted by a vapor stream of said material; measuring means for measuring the rate of evaporation of said material from a location outside said vapor stream impacting on said substrate an electrically conducting housing with an opening which can be aligned with material to be evaporated; a vapor sensing electrode located inside said housing and insulated from said housing; an evaluation device for the evaporation rate and connected to said electrode, said electrode being located outside the line of sight through said opening of said housing; a source of direct voltage and having a positive terminal connected to said electrode, said electrode having a positive potential with respect to said housing; and means for applying to said evaluation device the current flowing between housing and electrode.

2. The device as defined in claim 1 including a tube surrounding said opening of said housing and having a predetermined length, the length of said tube and the location of said electrode in relation to said opening being such that a direct line of sight path from outside said housing to said electrode is inhibited.

3. The measuring device as defined in claim 1 wherein said electrode is a ring-shaped electrode located coaxially with said opening.

4. The measuring device as defined in claim 1 including an auxiliary electrode with potential identical to the potential of said housing, said first-mentioned electrode being a plate-shaped electrode and having a larger surface aligned with the central axis of said electrode, said auxiliary electrode facing said larger surface and being symmetrical with respect to said central axis.

5. The measuring device as defined n claim 1 including an auxiliary electrode with potential identical to the potential of said housing, said first-mentioned electrode being a semi-ring with axis identical to the central axis of said first-mentioned electrode, said auxiliary electrode facing said first-mentioned electrode and being symmetrical with respect to said central axis.

6. The measuring device as defined in claim 1 wherein said housing has an auxiliary opening with cross-section substantially identical to the cross-section of said first-mentioned opening, said auxiliary opening facing said first-mentioned opening.

7. A measuring device for determining the evaporation rate of evaporation material in vacuum systems comprising, in combination, an electrically conducting housing with an opening which can be aligned with material to be evaporated; an electrode located inside said housing and insulated from said housing; an evaluation device for the evaporation rate and connected to said electrode, said electrode being located outside the line of sight through said opening of said housing, said electrode having a positive potential with respect to said housing; and means for applying to said evaluation device the current flowing between housing and electrode; said evaluation device including control circuit means comprising two integrating networks, one of said integrating networks having applied thereto the potential difference between said housing and said electrode; reference voltage means for applying a reference voltage to the other one of said integrating networks, said reference voltage corresponding to the nominal value of the evaporation rate; and final control means for controlling the power for evaporating said material, and means for applying the difference of the outputs of said integrating network to said final control means.

* * * * *